(12) United States Patent
Chen et al.

(10) Patent No.: US 10,797,209 B2
(45) Date of Patent: Oct. 6, 2020

(54) LIGHT EMITTING DEVICE WITH BEAM SHAPING STRUCTURE AND MANUFACTURING METHOD OF THE SAME

(71) Applicant: MAVEN OPTRONICS CO., LTD., Hsinchu (TW)

(72) Inventors: Chieh Chen, Palo Alto, CA (US); Tsung-Hsi Wang, Hsinchu (TW)

(73) Assignee: Maven Optronics Co., Ltd., Hsinchu County (TW)

( * ) Notice: Subject to any disclaimer, the term of this patent is extended or adjusted under 35 U.S.C. 154(b) by 143 days.

(21) Appl. No.: 15/423,513

(22) Filed: Feb. 2, 2017

(65) Prior Publication Data

US 2017/0229621 A1    Aug. 10, 2017

(30) Foreign Application Priority Data

Feb. 5, 2016  (CN) .......................... 2016 1 0082142
Feb. 5, 2016  (TW) .............................. 105104034 A

(51) Int. Cl.
*H01L 33/54*  (2010.01)
*H01L 33/52*  (2010.01)
(Continued)

(52) U.S. Cl.
CPC .............. *H01L 33/54* (2013.01); *H01L 33/50* (2013.01); *H01L 33/507* (2013.01); *H01L 33/52* (2013.01);
(Continued)

(58) Field of Classification Search
CPC ......... H01L 33/54; H01L 33/52; H01L 33/50; H01L 33/507; H01L 33/58;
(Continued)

(56) References Cited

U.S. PATENT DOCUMENTS 8,882,319 B2 * 11/2014 Kim ........................ H01L 33/46
                                                    362/516
8,896,001 B2    11/2014 Inoue et al.
(Continued)

FOREIGN PATENT DOCUMENTS

CN          103038880 A    4/2013
CN          103503182 A    1/2014
(Continued)

OTHER PUBLICATIONS

Extended Search Report for EP Patent Application No. 17154536.1, dated Jun. 19, 2017 in 6 pages.
(Continued)

*Primary Examiner* — Su C Kim
(74) *Attorney, Agent, or Firm* — Foley & Lardner LLP

(57) ABSTRACT

A chip scale packaging (CSP) light emitting diode (LED) device includes a flip-chip LED semiconductor die and a beam shaping structure (BSS) to form a monochromatic CSP LED device. A photoluminescent structure can be disposed on the LED semiconductor die to form a phosphor-converted white-light CSP LED device. The BSS is fabricated by dispersing light scattering particles with concentration equal to or less than 30% by weight into a polymer resin material, and is disposed adjacent to the edge portion of the photoluminescent structure or the LED semiconductor die; or disposed remotely above the photoluminescent structure or the LED semiconductor die. The BSS disposed at the edge portion of the device can reduce the edge-emitting light of the device; while the BSS disposed at the top portion of the device can reduce the top-emitting light of the device, therefore shaping the radiation pattern and the viewing angle of the device.

13 Claims, 11 Drawing Sheets

(51) Int. Cl.
*H01L 33/50* (2010.01)
*H01L 33/58* (2010.01)
*H01L 21/56* (2006.01)

(52) U.S. Cl.
CPC ............ *H01L 33/58* (2013.01); *H01L 21/568* (2013.01); *H01L 2224/04105* (2013.01); *H01L 2224/19* (2013.01); *H01L 2933/005* (2013.01); *H01L 2933/0033* (2013.01); *H01L 2933/0041* (2013.01); *H01L 2933/0058* (2013.01); *H01L 2933/0091* (2013.01)

(58) Field of Classification Search
CPC ......... H01L 2933/0091; H01L 2224/19; H01L 2224/04105; H01L 21/568; H01L 2933/0033; H01L 2933/0041; H01L 2933/005; H01L 2933/0058
See application file for complete search history.

(56) References Cited

U.S. PATENT DOCUMENTS

| | | | |
|---|---|---|---|
| 8,933,478 B2* | 1/2015 | Tischler | H01L 33/508 257/98 |
| 9,347,622 B2 | 5/2016 | Ulasyuk | F21V 3/12 |
| 2004/0217364 A1 | 11/2004 | Tarsa et al. | |
| 2006/0105482 A1* | 5/2006 | Alferink | H05B 45/20 438/22 |
| 2006/0261364 A1* | 11/2006 | Suehiro | H01L 33/56 257/100 |
| 2009/0057699 A1* | 3/2009 | Basin | H01L 33/56 257/98 |
| 2010/0320479 A1* | 12/2010 | Minato | H01L 33/505 257/88 |
| 2012/0142124 A1 | 6/2012 | Yoo et al. | |
| 2012/0319563 A1* | 12/2012 | Ishihara | H01L 33/505 313/498 |
| 2013/0037842 A1 | 2/2013 | Yamada et al. | |
| 2013/0140580 A1 | 6/2013 | Wirth et al. | |
| 2013/0234187 A1 | 9/2013 | Ebe et al. | |
| 2013/0240925 A1* | 9/2013 | Lai | H01L 33/648 257/98 |
| 2013/0300285 A1 | 11/2013 | Ito | |
| 2014/0071689 A1 | 3/2014 | Yoon et al. | |
| 2014/0252387 A1 | 9/2014 | Kishi et al. | |
| 2014/0264422 A1 | 9/2014 | Windisch et al. | |
| 2015/0091035 A1 | 4/2015 | Kim et al. | |
| 2016/0104827 A1* | 4/2016 | Hong | G02F 1/133617 349/71 |
| 2016/0187566 A1 | 6/2016 | Yao | |
| 2016/0240746 A1* | 8/2016 | Yun | H01L 33/56 |

FOREIGN PATENT DOCUMENTS

| | | |
|---|---|---|
| CN | 104570481 A | 4/2015 |
| CN | 105161609 A | 12/2015 |
| DE | 10 2010 021 011 A1 | 11/2011 |
| EP | 2 216 834 A1 | 8/2010 |
| EP | 2 709 175 A1 | 3/2014 |
| JP | WO-2011/099384 A1 | 8/2011 |
| JP | 2012-504860 A | 2/2012 |
| JP | WO-2012/099145 A1 | 7/2012 |
| JP | 2014-057061 A | 3/2014 |
| JP | 2014-175543 A | 9/2014 |
| KR | 2010-0091992 A | 8/2010 |
| KR | 2012-0061376 A | 6/2012 |
| TW | 200505054 A | 2/2005 |
| TW | 201342669 A | 10/2013 |
| TW | 201431124 A | 8/2014 |
| TW | 201501367 A | 1/2015 |
| WO | WO-2009/069671 A1 | 6/2009 |
| WO | WO-2010/038097 A1 | 4/2010 |
| WO | WO-2015/198220 A1 | 12/2015 |

OTHER PUBLICATIONS

Office Action for corresponding Taiwan Patent Application No. 105104034, dated Oct. 17, 2016 in 12 pages.
Office Action and Search Report for corresponding Chinese Patent Application No. 201610082142.6, dated Jun. 27, 2018, 9 pages.
Office Action from corresponding Japan Patent Application No. 2017-017728, dated Mar. 6, 2018, 6 pages.
Office Action from corresponding Korean Patent Application No. 10-2017-0015622, dated Dec. 4, 2017, 9 pages.
Office Action and Search Report for corresponding Chinese Patent Application No. 201610082142.6, dated Feb. 11, 2019, 9 pages.
Office Action from corresponding Japan Patent Application No. 2017-017728, dated Nov. 20, 2018, 7 pages.

* cited by examiner

LIGHT EMITTING DEVICE WITH BEAM SHAPING STRUCTURE AND MANUFACTURING METHOD OF THE SAME

CROSS-REFERENCES TO RELATED APPLICATIONS

This application claims the benefit of and priority to Taiwan Patent Application No. 105104034 filed on Feb. 5, 2016 and Chinese Patent Application No. 201610082142.6 filed on Feb. 5, 2016, the disclosures of which are incorporated herein by reference in their entirety.

BACKGROUND

Technical Field

The present disclosure relates to a light emitting device and the manufacturing method thereof, in particular to a chip-scale packaging light emitting device including a light emitting diode (LED) semiconductor die which generates electromagnetic radiation while it is in operation.

Description of the Related Art

Recent development of a chip-scale packaging (CSP) LED device has attracted more and more attention due to its promising advantages. As a typical example, a white-light CSP LED device as shown in FIG. 1A is generally composed of a flip-chip LED semiconductor die 71 and a photoluminescent structure 72 covering the LED semiconductor die with a compact chip-scale size. The photoluminescent structure 72 covers the upper surface and the four side edges of the edge surface of the LED semiconductor die 71, so that the CSP LED device irradiates light from its upper surface as well as the four side edges of its edge surface. Thus, the light is emitted from the five surfaces in different directions of the CSP LED device to form a five-surface emitting light source.

In comparison with a plastic leaded chip carrier (PLCC) LED device, a CSP LED device shows the following advantages: (1) The material cost is considerably less by eliminating the use of a bonding wire and a lead frame. (2) The thermal resistance between a LED semiconductor die and a mounting substrate, typically a printed circuit board (PCB), is further reduced without using a lead frame in between. Therefore the LED operation temperature is lowered while under the same driving current. In other words, less electrical energy can be consumed to obtain more optical power for a CSP LED device. (3) A lower operation temperature provides a higher LED semiconductor quantum efficiency for a CSP LED device. (4) A much smaller form factor of the light source provides more design flexibility for module-level LED fixtures. (5) A CSP LED device having a small light emitting area more resembles a point source and thus makes the design of an optical lens easier. A compact CSP LED device can be designed to generate small-Etendue light with higher optical intensity that is specified for some projected light applications, such as automobile headlights.

Even though the CSP LED device has many advantages, however, the comparative five-surface emitting CSP LED device has a larger viewing angle. This viewing angle generally ranges from 140 degrees to 160 degrees according to various geometrical dimensions of a specific CSP LED device. The viewing angle of a five-surface emitting CSP LED device is still considerably larger than that of the PLCC LED device, which is typically around 120 degrees. Although the CSP LED device having a large viewing angle is advantageous to some applications, it is not suitable for certain applications specifying a projection light source with a small viewing angle. For example, the applications such as edge-lit backlight units or the projection lamps specify a light source having a small viewing angle to attain higher light energy transmission efficiency. Therefore, there is a need to provide a CSP LED device having a narrower viewing angle to meet the specifications of such applications.

An optical lens can be used in conjunction with an LED device to shape its spatial radiation pattern, such as to increase or to reduce the viewing angle. However, this approach of using an optical lens may not be suitable in certain applications with space constraints. Adding an additional optical lens to the CSP LED device not only increases the manufacturing cost, but also occupies more overall space, defeating one of the significant advantages of a CSP LED device having a small form factor.

FIG. 1B illustrates another type of comparative "top-surface emitting" CSP LED device, which provides a smaller viewing angle. The CSP LED device is composed of a flip-chip LED semiconductor die 71, a photoluminescent structure 72, and a reflective structure 73. The photoluminescent structure 72 is disposed on the upper surface of the LED semiconductor die 71, whereas the reflective structure 73 covers the four side edges of the edge surface of the LED semiconductor die 71. In such a structure, the light is forced to escape from the upper surface of the CSP LED device, or top-surface emitting, so that a smaller viewing angle is provided accordingly. The viewing angle of this comparative top-surface emitting CSP LED device typically ranges from 120 degrees to 130 degrees. As for the composition materials used to fabricate the CSP LED device illustrated in FIG. 1B, the reflective structure 73 is formed by mixing light scattering particles into a polymer resin material, and the concentration of the light scattering particles is generally higher than 30 wt. % to serve as a light reflector. However, the reflective structure 73 made of this composition material is still not a very good reflector to rebound the light emitted from the LED semiconductor die 71 or the photoluminescent structure 72. Inevitably, some photons will dissipate inside the reflective structure 73 if the reflectance is not high enough. For example, as shown in FIG. 1C, the photons penetrate through the reflective structure 73 with a light path P and is finally absorbed at the end point P' inside the reflective structure 73. Photon dissipation inside the reflective structure 73 therefore degrades the optical efficacy of the CSP LED device. Furthermore, as for the manufacturing method to fabricate the CSP LED device illustrated in FIG. 1C, additional fabrication processes are included to cover the four side edges of the edge surface of the LED semiconductor die 71 with the reflective material to form the reflective structure 73. If a high-precision mold is used to fabricate the reflective structure 73, the manufacturing cost will significantly increase to allow high accuracy of placement.

SUMMARY

In view of the above-explained deficiencies, an improved CSP LED device with a beam shaping structure is disclosed according to the present disclosure. The viewing angle or spatial radiation pattern can be adjusted to fit various applications without using an inefficient reflector, which will result in excessive optical energy dissipation because of the light trapped inside the CSP LED device structure. Another advantage of the CSP LED device is to maintain its small form factor using a streamlined fabrication process without high manufacturing cost.

One object according to some embodiments of the present disclosure is to provide a CSP LED device and a manufacturing method thereof. Through a proper 100 design of a Beam Shaping Structure (BSS), the viewing angle of the CSP LED device can be reduced ranging from about 120 degrees to about 140 degrees compared with a comparative five-surface emitting CSP LED device, whose viewing angle ranges from 140 degrees to 160 degrees, while maintaining substantially the same form factor. The CSP LED device can be fabricated using a relatively streamlined and less expensive manufacturing process. Through another embodiment of a BSS according to the present disclosure, the viewing angle of the CSP LED device can be increased to be larger than about 160 degrees compared with a comparative five-surface emitting CSP LED to fulfill the specifications of certain applications.

To achieve the aforementioned object, a smaller viewing angle CSP LED device according to some embodiments of the present disclosure comprises an LED semiconductor die, a photoluminescent structure, and a beam shaping structure. The LED semiconductor die is a flip-chip LED semiconductor die having an upper surface, a substantially in parallel but opposite lower surface, an edge surface and a set of electrodes. The photoluminescent structure is formed covering the upper surface and the edge surface of the LED semiconductor die, and the BSS is strategically disposed covering an edge portion of the photoluminescent structure. The BSS is fabricated with composition materials made of dispersing light scattering particles inside a polymer resin material with a relatively low concentration of the light scattering particles, such as equal to or less than about 30 wt. %, equal to or less than about 20 wt. %, or equal to or less than about 10 wt. %. Thus, a portion of the light emitted from the four side edges of the LED semiconductor die and the four side edges of the photoluminescent structure travelling inside the BSS in a near horizontal direction can be scattered and redirected to near vertical directions. Therefore the light intensity in near vertical directions will be increased, thus reducing the overall viewing angle of the CSP LED device.

To achieve the aforementioned object, a larger viewing angle CSP LED device according to some embodiments of the present disclosure comprises an LED semiconductor die, a photoluminescent structure, a supernatant light-transmitting layer, and a BSS. The LED semiconductor die is a flip-chip LED semiconductor die having an upper surface, a substantially in parallel but opposite lower surface, an edge surface and a set of electrodes. The photoluminescent structure is formed covering the upper surface and the edge surface of the LED semiconductor die. The supernatant light-transmitting layer is strategically disposed on the photoluminescent structure so that the BSS covers a top surface of the supernatant light-transmitting layer. The BSS is fabricated with composition materials made of dispersing light scattering particles inside a polymer resin material with a relatively low concentration of the light scattering particles, such as equal to or less than about 30 wt. %, equal to or less than about 20 wt. %, or equal to or less than about 10 wt. %. Thus, partial light emitted from the LED semiconductor die and the photoluminescent structure in the near vertical direction can be scattered and redirected to near horizontal directions, thus increasing the overall viewing angle of the CSP LED device.

To achieve the aforementioned object, another smaller viewing angle monochromatic CSP LED device according to some embodiments of the present disclosure comprises an LED semiconductor die and a BSS. The LED semiconductor die is a flip-chip LED semiconductor die having an upper surface, a substantially in parallel but opposite lower surface, an edge surface and a set of electrodes. The BSS covers at least the edge surface of the LED semiconductor die. The BSS is fabricated with composition materials made of dispersing light scattering particles inside a polymer resin material with a relatively low concentration of light scattering particles, such as equal to or less than about 30 wt. %, equal to or less than about 20 wt. %, or equal to or less than about 10 wt. %. Thus, partial light emitted from the LED semiconductor die in the near horizontal direction can be scattered and redirected to the near vertical directions to reduce the overall viewing angle of the CSP LED device.

To achieve the aforementioned object, a manufacturing method of the CSP LED device according to some embodiments of the present disclosure comprises: 1) arranging a plurality of LED semiconductor dies on a release layer to form an array of LED semiconductor dies; 2) forming a plurality of connected packaging structures on the array of LED semiconductor dies; wherein beam shaping structures are formed as part of the packaging structures, and 3) singulating the plurality of packaging structures, wherein the release layer can be removed before or after singulating the plurality of packaging structures.

Therefore, the present disclosure provides at least the following advantages. Since the BSS of the CSP LED device has a relatively low concentration (for example, equal to or less than about 30 wt. %) of light scattering particles, partial light emitted from the LED semiconductor die and/or the photoluminescent structure is scattered with altered directions while travelling through the BSS. Thus the light intensity in the original travelling direction is reduced, and the viewing angle of the CSP LED device is changed accordingly. With a proper design of the BSS, dissipation of excessive photons inside the reflective structure suffered by the comparative top-surface emitting CSP LED device is mitigated. Thus, the overall luminous efficacy can be improved.

As an example, when the BSS is strategically disposed surrounding the side edges of the CSP LED device, partial light originally travelling in the near horizontal direction of the LED semiconductor die is scattered to near vertical directions while passing through the BSS; however, the light originally travelling in near vertical direction will not experience the scattering effect of the BSS. Therefore, the intensity of light travelling in the near horizontal direction of the CSP LED device is reduced, while the intensity of light travelling in the near vertical direction of the CSP LED device is increased, thus resulting in an overall reduced viewing angle. In other words, the CSP LED device of some embodiments of the present disclosure can provide a smaller viewing angle ranging from about 120 degrees to about 140 degrees.

As another example, when the BSS is strategically disposed remotely above the LED semiconductor die with a spacer in between, the intensity of the light originally travelling in the near vertical direction of the CSP LED device is reduced so that the intensity of the light travelling in the near horizontal direction of the CSP LED device is increased. In other words, the overall viewing angle can be increased to, for example, about 160 degrees or about 170 degrees.

In addition, the BSS of some embodiments of the present disclosure can be fabricated using a well-controlled but less expensive manufacturing process. Also, the BSS is incorporated inside the CSP LED device without increasing the overall geometric envelope of the device. Therefore, it is well suitable to various applications by adjusting the viewing angle of CSP LED devices.

Other aspects and embodiments of the disclosure are also contemplated. The foregoing summary and the following detailed description are not meant to restrict the disclosure to any particular embodiment but are merely meant to describe some embodiments of the disclosure.

DETAILED DESCRIPTION

Definitions

Figure 1A:
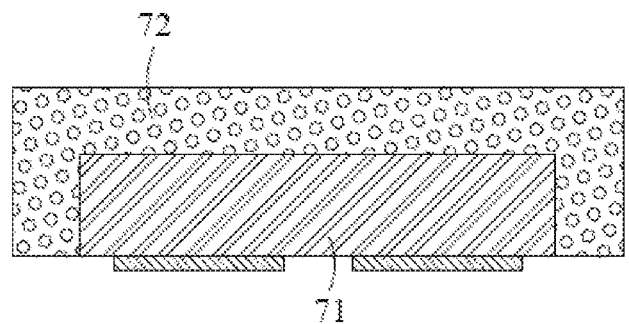
FIG. 1A and FIG. 1B are schematic drawings in cross-sectional views depicting comparative CSP LED devices.
Figure 1B:
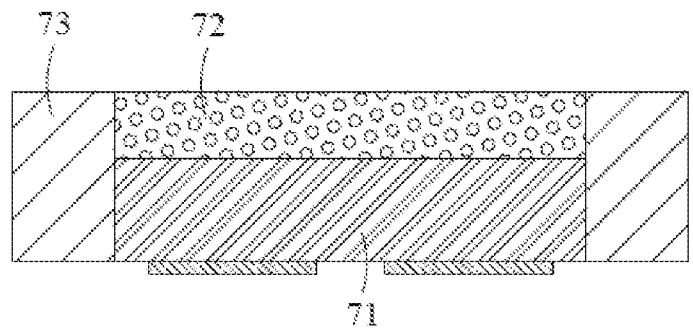
Figure 1C:
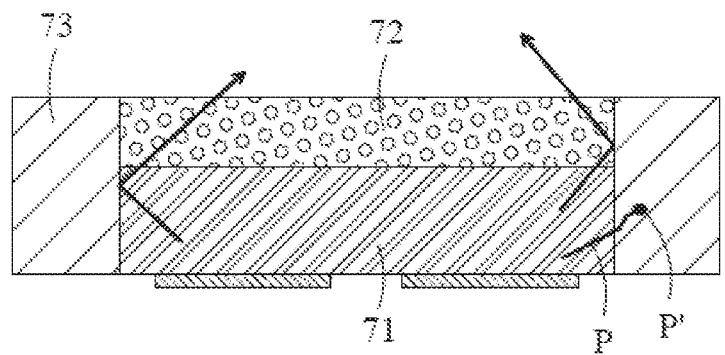
FIG. 1C is a schematic drawing in a cross-sectional view illustrating a light dissipation mechanism of the comparative CSP LED device.

The following definitions apply to some of the technical aspects described with respect to some embodiments of the invention. These definitions may likewise be expanded upon herein.

As used herein, the singular terms "a," "an," and "the" include plural referents unless the context clearly dictates otherwise. Thus, for example, reference to a layer can include multiple layers unless the context clearly dictates otherwise.

As used herein, the term "set" refers to a collection of one or more components. Thus, for example, a set of layers can include a single layer or multiple layers. Components of a set also can be referred to as members of the set. Components of a set can be the same or different. In some instances, components of a set can share one or more common characteristics.

As used herein, the term "adjacent" refers to being near or adjoining. Adjacent components can be spaced apart from one another or can be in actual or direct contact with one another. In some instances, adjacent components can be connected to one another or can be formed integrally with one another. In the description of some embodiments, a component provided "on" or "on top of" or "above" another component can encompass cases where the former component is directly on (e.g., in direct physical contact with) the latter component, as well as cases where one or more intervening components are located between the former component and the latter component. In the description of some embodiments, a component provided "underneath" another component can encompass cases where the former component is directly beneath (e.g., in direct physical contact with) the latter component, as well as cases where one or more intervening components are located between the former component and the latter component.

As used herein, the terms "connect," "connected," and "connection" refer to an operational coupling or linking. Connected components can be directly coupled to one another or can be indirectly coupled to one another, such as via another set of components.

As used herein, the terms "about", "substantially", and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical tolerance levels of the manufacturing operations described herein. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two surfaces can be deemed to be substantially level or aligned if any displacement between the surfaces is 50 μm or less, such as 40 μm or less, 30 μm or less, 20 μm or less, 10 μm or less, 5 μm or less, 1 μm or less, or 0.5 μm or less.

As used herein with respect to photoluminescence, the term "efficiency" or "quantum efficiency" refers to a ratio of the number of output photons to the number of input photons.

As used herein, the term "size" refers to a characteristic dimension. In the case of an object (e.g., a particle) that is spherical, a size of the object can refer to a diameter of the object. In the case of an object that is non-spherical, a size of the object can refer to an average of various orthogonal dimensions of the object. Thus, for example, a size of an object that is a spheroidal can refer to an average of a major axis and a minor axis of the object. When referring to a set of objects as having a particular size, it is contemplated that the objects can have a distribution of sizes around that size. Thus, as used herein, a size of a set of objects can refer to a typical size of a distribution of sizes, such as an average size, a median size, or a peak size.

Figure 2A:
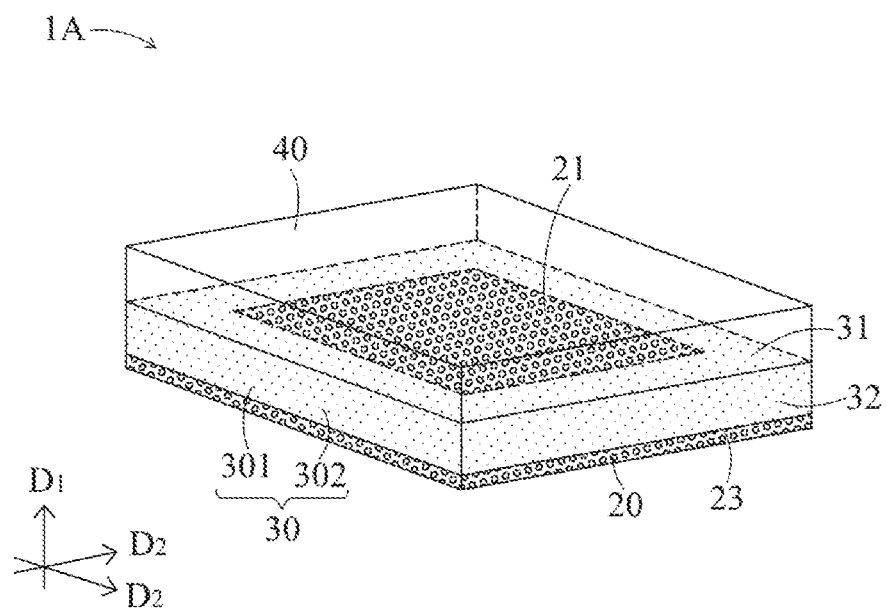
FIG. 2A is a schematic drawing in a 3D perspective view and FIG. 2B is a schematic drawing in a cross-sectional view depicting a CSP LED device according to one embodiment of the present disclosure.
Figure 2B:
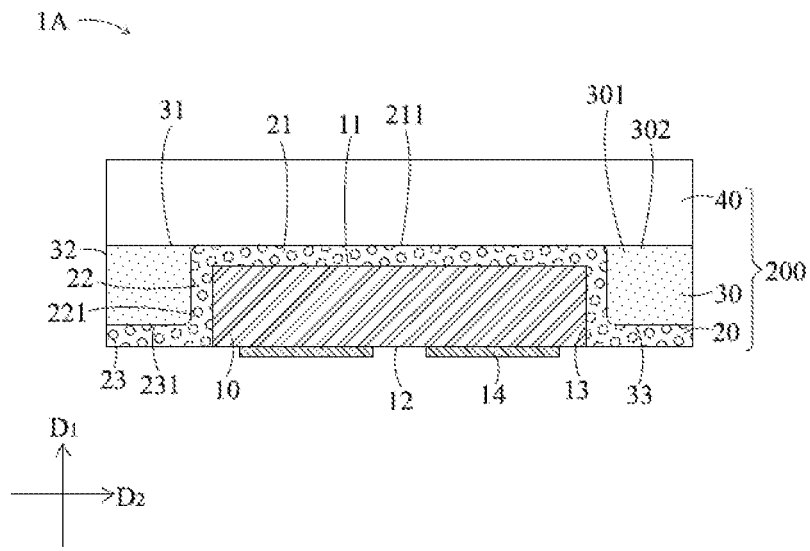

FIG. 2A is a schematic drawing in a 3D perspective view, and FIG. 2B is a schematic drawing in a cross-sectional view of a CSP LED device 1A according to one embodiment of the present disclosure. The CSP LED device 1A comprises an LED semiconductor die 10, a photoluminescent structure 20, a beam shaping structure (BSS) 30, and a supernatant light-transmitting layer 40. A packaging structure 200 comprises the photoluminescent structure 20, the BSS 30, and the supernatant light-transmitting layer 40. The detailed technical contents are described as follows.

The LED semiconductor die 10 is desirably a flip-chip type LED semiconductor die having an upper surface 11, a lower surface 12, an edge surface 13, and a set of electrodes 14. The upper surface 11 and the lower surface 12 are formed substantially in parallel, facing oppositely to each other. The edge surface 13 is formed between the upper surface 11 and the lower surface 12, connecting the outer rim of the upper surface 11 with that of the lower surface 12.

The set of electrodes 14, or a plurality of electrodes, is disposed on the lower surface 12. The electrical energy is applied to the LED semiconductor die 10 through the set of electrodes 14 so that electro-luminescence is generated. As for the specific structure, the active region that causes electro-luminescence is usually located near the lower position (close to the lower surface 12) of the flip-chip LED semiconductor die 10. Thus, the light generated by the active region will pass through the upper surface 11 and the edge surface 13 to irradiate outwardly. The flip-chip LED semiconductor die 10 accordingly emits the light from the upper surface 11 and the edge surface 13 (four peripheral side edges), namely, forming a five-surface emitting LED semiconductor die.

The main function of the photoluminescent structure 20 is to convert the wavelength of the light irradiated from the upper surface 11 and the edge surface 13 of the LED semiconductor die 10. Specifically, when the blue light irradiated from the LED semiconductor die 10 passes through the photoluminescent structure 20, partial blue light can be down-converted into a lower energy light having a longer wavelength by a photoluminescent material included in the photoluminescent structure 20. Thus, the light of different wavelengths emitted by the photoluminescent material and the LED semiconductor die 10 can be mixed in a prescribed ratio to generate a light with a desired color, for example, white light of various color temperatures.

As for the structure of the device 1A, the photoluminescent structure 20 further comprises a top portion 21, an edge portion 22, and an extension portion 23. The top portion 21 is formed to down-convert the light emitted from the upper surface 11 into a longer wavelength by covering the upper surface 11 of the LED semiconductor die 10; whereas the edge portion 22 is formed to down-convert the light irradiated from the edge surface 13 into a longer wavelength by covering the edge surface 13 of the LED semiconductor die 10. The extension portion 23 extends outwardly from the edge portion 22. Both of the edge portion 22 and the extension portion 23 are formed surrounding the LED semiconductor die 10, wherein the thickness of the extension portion 23 is desirably less than that of the LED semiconductor die 10. As illustrated in FIG. 2B, the top portion 21 has an upper surface 211; whereas the edge portion 22 has an edge surface 221. The extension portion 23 has an upper surface 231.

The BSS 30 is disposed surrounding the photoluminescent structure 20 so that the viewing angle of the CSP LED device 1A can be reduced by the BSS 30. By convention, the viewing angle of an LED device is generally specified as the Full Width at Half Maximum (FWHM) of the spatial radiation pattern, wherein the FWHM represents the "width" (or angle) across the spatial radiation pattern when the light intensity equals to half of its peak value (half maximum).

Specifically, when a CSP LED device does not have the BSS 30, the light passing through the photoluminescent structure 20 will typically form a radiation pattern having a viewing angle ranging from 140 degrees to 160 degrees. By contrast, when a CSP LED device incorporates the BSS 30, the viewing angle is then reduced to less than about 140 degrees, for example, ranging from about 120 degrees to about 140 degrees.

More specifically, the BSS 30 covers both the edge surface 221 of the edge portion 22 and the upper surface 231 of the extension portion 23 of the photoluminescent structure 20. Variant embodiments of the BSS 30 can be achieved using different process conditions. For example, as shown in FIG. 2A and FIG. 2B, an upper surface 31 of the BSS 30 is substantially leveled or aligned with the upper surface 211 of the top portion 21 of the photoluminescent structure 20, wherein the top portion 21 of the photoluminescent structure 20 is not covered by and is exposed from the BSS 30.

Figure 3A:
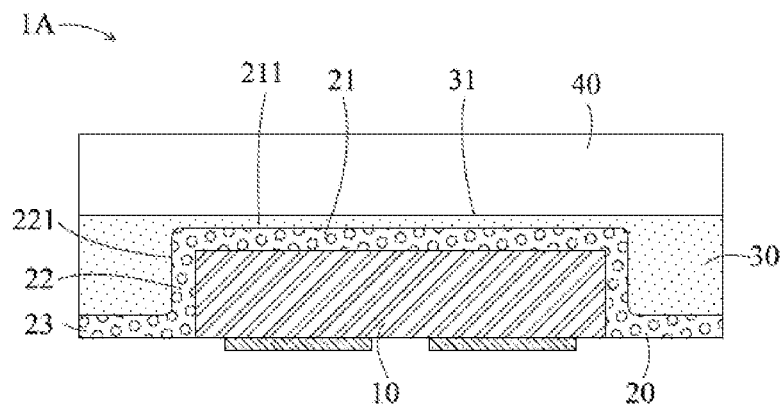
FIG. 3A and FIG. 3B are schematic drawings in cross-sectional views depicting variant embodiments of the CSP LED device shown in FIG. 2B.
Figure 3B:
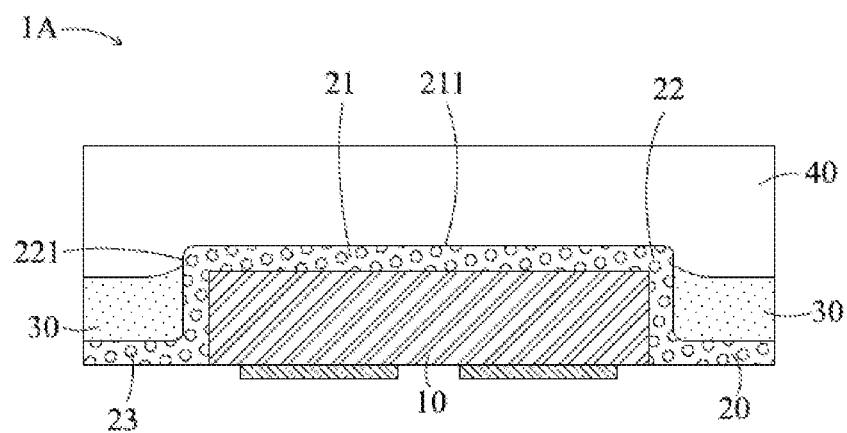

As for other variant embodiments, as shown in FIG. 3A, the BSS 30 may slightly extend over and cover the upper surface 211 of the top portion 21 of the photoluminescent structure 20. As illustrated in FIG. 3B, the upper surface 31 of the BSS 30 may be slightly lower than the upper surface 211 of the top portion 21 of the photoluminescent structure 20 so that the top portion 21 is not covered, as well as the edge portion 22 is partially exposed from the BSS 30. In other words, the BSS 30 formed surrounding the edge portion 22 of the photoluminescent structure 20 may selectively cover the top portion 21 or selectively and partially cover the edge surface 221 of the edge portion 22.

Referring to FIG. 2A and FIG. 2B, the BSS 30 is fabricated using a polymer resin material 301 and light scattering particles 302 dispersed inside the polymer resin material 301 to change the travelling direction of the light. The light scattering particles 302 may be chosen from one of the materials, such as $TiO_2$, BN, $SiO_2$, $Al_2O_3$, other metal, non-metal oxide, or any combination thereof. The polymer resin material 301 used to bind the light scattering particles 302 is desirably optically transparent. The polymer resin material 301 may be chosen from one of the thermally curable materials including silicone, epoxy or rubber, or any combination thereof.

When the light scattering particles 302 is excessively dispersed into the BSS 30 with high concentration, passage of the light through the BSS 30 is rendered difficult. Thus, the weight percentage wt. % of the light scattering particles 302 in the BSS 30 is not greater than about 30 wt. %, not greater than about 25 wt. %, not greater than about 20 wt. %, not greater than about 15 wt. %, or not greater than about 10 wt. %. In other words, the BSS 30 comprises the light scattering particles 302 with relatively low concentration.

It is desirable that the light scattering particles 302 are uniformly dispersed inside the thermally curable polymer resin material 301 for the sake of ease of fabrication. However, it will be appreciated that during a fabrication process the light scattering particles 302 may not be uniformly dispersed inside the polymer resin material 301 due to the gravity effect or caused by other factors. Another example embodiment is that the light scattering particles 302 may be intentionally introduced to have a higher concentration at certain locations inside the polymer resin material 301. For example, if the polymer resin material 301 is disposed to cover both the top portion 21 and the edge portion 22 of the photoluminescent structure 20, the light scattering particles 302 may desirably have a higher concentration at the location surrounding the edge portion 22 of the photoluminescent structure 20 and has a smaller concentration at the location covering the top portion 21 of the photoluminescent structure 20. Thus, the light irradiated from the top portion 21 will not experience as strong of a light scattering effect compared to the light irradiated from the edge portion 22 of the photoluminescent structure 20.

As illustrated in FIG. 2A and FIG. 2B, the supernatant light-transmitting layer 40 is disposed on the BSS 30 to cover the upper surface 31 of the BSS 30, serving as an environmentally protective layer as well as a planarization layer for the photoluminescent structure 20 and the BSS 30. If the BSS 30 is not intended to cover the top portion 21 of the photoluminescent structure 20, as shown in FIG. 2B and FIG. 3B, the supernatant light-transmitting layer 40 can simultaneously cover and adjoin the upper surface 211 of the photoluminescent structure 20 and the upper surface 31 of the BSS 30.

Figure 2C:
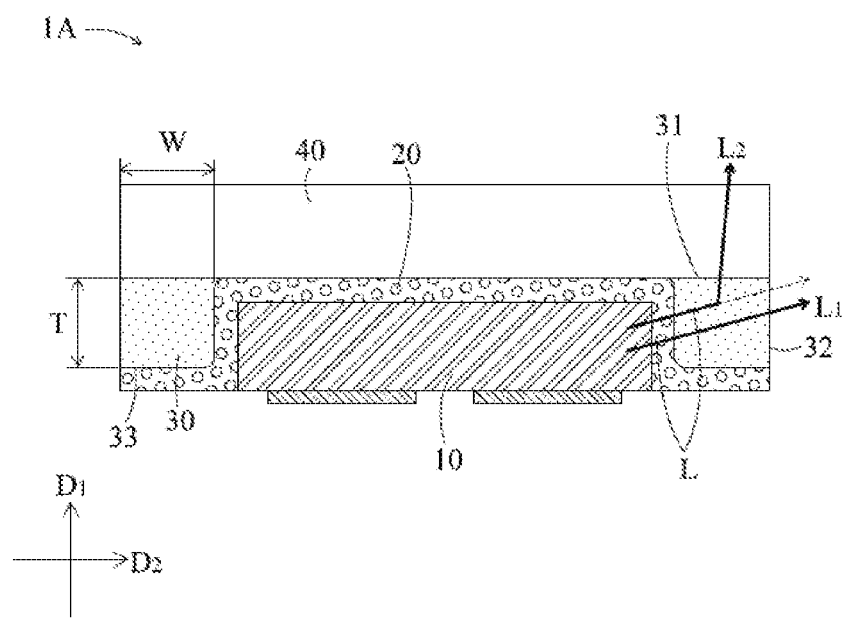
FIG. 2C is a schematic drawing in a cross-sectional view illustrating light beam re-direction mechanism inside a BSS of the CSP LED device shown in FIG. 2B.

FIG. 2C is a schematic drawing in a cross-sectional view of the CSP LED device 1A, wherein the beam shaping mechanism is depicted to illustrate how the viewing angle of the CSP LED device 1A is changed.

Since the BSS 30 formed covering the edge portion 22 of the photoluminescent structure 20 has a relatively low concentration (for example, not greater than about 30 wt. %) of the light scattering particles 302, the light beam L emitted from the LED semiconductor die 10 and passing through the photoluminescent structure 20 in the near horizontal direction D2 will penetrate through the BSS 30. Inside the BSS 30, a portion of the light beam L (L1) keeps travelling near its original direction (e.g., in the near horizontal direction D2), and finally escapes from the edge surface 32 of the BSS 30. Another portion of the light beam L (L2) considerably changes its travelling direction and is redirected toward the near vertical direction D1 by the light scattering particles 302, and finally emitted outwardly from the upper surface 31 of the BSS 30.

In other words, after the light beam L originally travelling in the near horizontal direction D2 passes through the BSS 30, a portion of the light beam L1 keeps travelling outwardly in the near horizontal direction D2, and another portion of the light beam L2 is scattered to the near vertical direction D1. As a result, the intensity of the light beam irradiated in the near horizontal direction D2 of the CSP LED device 1A is reduced, whereas the intensity of the light beam irradiated in the near vertical direction D1 of the CSP LED device 1A is increased. Therefore, the light beam emitted from the CSP LED device 1A will emit more intensity in the near vertical direction D1, thus having a smaller viewing angle as compared with a comparative CSP LED device without a BSS. Also, since the BSS 30 has a relatively low concentration of the light scattering particles 302, the probability of dissipation of photons inside the BSS 30 is reduced; therefore the overall luminous efficacy of the CSP LED device 1A is improved.

Furthermore, two design parameters of the BSS 30 affecting the viewing angle, such as the weight percent of the light scattering particles 302 and the geometrical dimensions of the BSS 30, are illustrated in detail in the following paragraphs.

The first design parameter of the BSS is the scattering particles concentration. When the BSS 30 has a higher concentration of the light scattering particles 302 (quantified by wt. %), the viewing angle of the CSP LED device 1A tends to be smaller. As illustrated by the measurement results summarized in Table 1 below, the viewing angle decreases from about 128 degrees (embodiment device T1) to about 126 degrees (embodiment device T2) when the concentration of the light scattering particles 302 increases from about 1.5 wt. % (embodiment device T1) to about 2.5 wt. % (embodiment device T2), wherein the other device parameters are kept to be the same. It will be appreciated that when the BSS 30 has a higher concentration of the light scattering particles 302, the light beam L will have a higher probability to experience more light scattering effect during passing through the BSS 30, thus the higher probability for light beam L to be scattered and re-directed to different travelling directions. Therefore the light intensity in the near horizontal direction D2 is reduced while the light intensity in the near vertical direction D1 is enhanced; so the overall viewing angle of the CSP LED device 1A becomes smaller.

In some embodiments, it is desirable that the weight percentage of the light scattering particles 302 is less than about 10% and more than about 0.1% so that the CSP LED device 1A can provide a light beam having a viewing angle ranging from about 120 degrees to about 140 degrees.

TABLE 1 measured viewing angles embodied with various parameters of the BSS 30:

| Item | Wt. % of light scattering particles (%) | $1^{st}$ characteristic dimension W (μm) | $2^{nd}$ characteristic dimension T (μm) | Viewing Angle (degree) |
| --- | --- | --- | --- | --- |
| Embodiment Device T1 | 1.5 | 180 | 150 | 128 |
| Embodiment Device T2 | 2.5 | 180 | 150 | 126 |
| Embodiment Device T3 | 1.5 | 250 | 150 | 124 |
| Comparative CSP LED device | without BSS | | | 140 |

As for another design factor, two parameters are specified to characterize the geometrical dimensions of BSS 30. As shown in FIG. 2C, a first characteristic dimension W is specified as a horizontal distance from the edge surface 221 of the photoluminescent structure 20 to the edge surface 32 of the BSS 30, and a second characteristic dimension T is specified as a vertical distance from a lower surface 33 to the upper surface 31 of the BSS 30. Then, an aspect ratio may be further specified as the first characteristic dimension W divided by the second characteristic dimension T, namely W/T. It will be appreciated that the larger the aspect ratio W/T is, the smaller the viewing angle will be. In comparison with the measurement results of Embodiment Device T1 and Embodiment Device T3 summarized in Table 1, the viewing angle decreases from about 128 degrees to about 124 degrees while the aspect ratio W/T increases from about 180 μm/150 μm to about 250 μm/150 μm, wherein other parameters of the BSS are kept to be the same. When the BSS 30 has a larger aspect ratio W/T, the light beam L travelling along the near horizontal direction D2 will experience more light scattering effect inside the BSS 30. After the light beam L is scattered to the near vertical direction D1, the travelling distance for the light beam L to escape from the BSS 30 in near vertical direction is shorter. Thus the light beam L will then experience less light scattering effect in the near vertical direction D1. Therefore, the light intensity in the near horizontal direction D2 is reduced while the light intensity in the near vertical direction D1 is enhanced, and then the overall viewing angle of the CSP LED device 1A becomes smaller. In some embodiments, the aspect ratio W/T can be greater than about 1, such as about 1.1 or greater, about 1.2 or greater, about 1.3 or greater, about 1.4 or greater, or about 1.5 or greater, and up to about 1.8 or greater, or up to about 2 or greater.

Furthermore, in addition to the BSS 30, the supernatant light-transmitting layer 40 also plays a role to shape the viewing angle of the CSP LED device 1A. The CSP LED device 1A may optionally incorporate the supernatant light-transmitting layer 40 so that the light travelling in the near vertical direction D1 will be refracted while penetrating through the supernatant light-transmitting layer 40, so that the overall viewing angle is enlarged. According to one measurement result, the CSP LED device 1A having the supernatant light-transmitting layer 40 shows a viewing angle of about 125 degrees, while the CSP LED device 1A without the supernatant light-transmitting layer 40 (not illustrated) shows a viewing angle of about 120 degrees.

In addition to shaping the viewing angle, the supernatant light-transmitting layer 40 may also improve the light extraction efficiency or the luminous efficacy of the CSP LED device 1A. According to one measurement result, the CSP LED device 1A having the supernatant light-transmitting layer 40 shows the luminous efficacy of about 5% higher than that of the CSP LED device 1A without the supernatant light-transmitting layer 40. Further, the supernatant light-transmitting layer 40 may be fabricated using a polymer resin material having a lower refractive index (RI) than that of the photoluminescent structure 20 and the BSS 30. Thus, proper RI matching can be implemented so that light energy loss caused by the total internal reflection occurring at the interfaces between various mediums, including the photoluminescent structure 20, the BSS 30, the supernatant light-transmitting layer 40, and the ambient environment (air), is reduced. Therefore, the light extraction efficiency and the luminous efficacy of the CSP LED device 1A can be further improved.

Therefore, the supernatant light-transmitting layer 40 can be incorporated into the CSP LED device 1A according to the desired viewing angle and the overall luminous efficacy.

In addition, according to variant embodiments as shown in FIG. 2B, FIG. 3A, and FIG. 3B, the BSS 30 can cover the photoluminescent structure 20 to different extents to shape the viewing angle of the CSP LED device 1A.

The aforementioned paragraphs are detailed descriptions of the embodiment related to the CSP LED device 1A. Detailed descriptions of other embodiments of CSP LED devices according to the present disclosure are explained as follows. It will be appreciated that some detailed descriptions of the features and advantages found in the following embodiments of the light emitting devices are similar to those of the CSP LED device 1A and are therefore omitted for the purpose of brevity.

Figure 4:
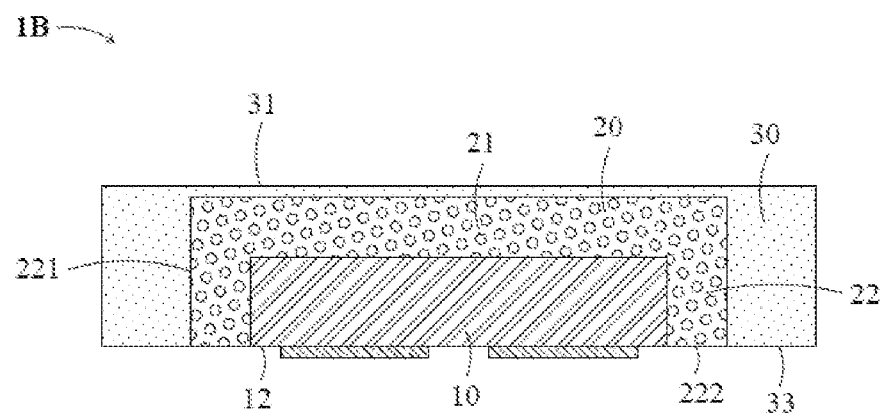
FIG. 4 is a schematic drawing in a cross-sectional view depicting a CSP LED device according to another embodiment of the present disclosure.

FIG. 4 is a schematic drawing in a cross-sectional view of a CSP LED device 1B according to another embodiment of the present disclosure. The difference between the CSP LED device 1B and the CSP LED device 1A is at least that the photoluminescent structure 20 of the CSP LED device 1B does not include the extension portion 23 as in CSP LED device 1A. Thus, the lower surface 33 of the BSS 30 is substantially level or aligned with the lower surface 222 of the edge portion 22, and may also be substantially level or aligned with the lower surface 12 of the LED semiconductor die 10. In addition, the thickness of the photoluminescent structure 20 of the CSP LED device 1B can be greater than that of the photoluminescent structure 20 of the CSP LED device 1A if a molding process is performed to fabricate the photoluminescent structure 20.

Figure 5:
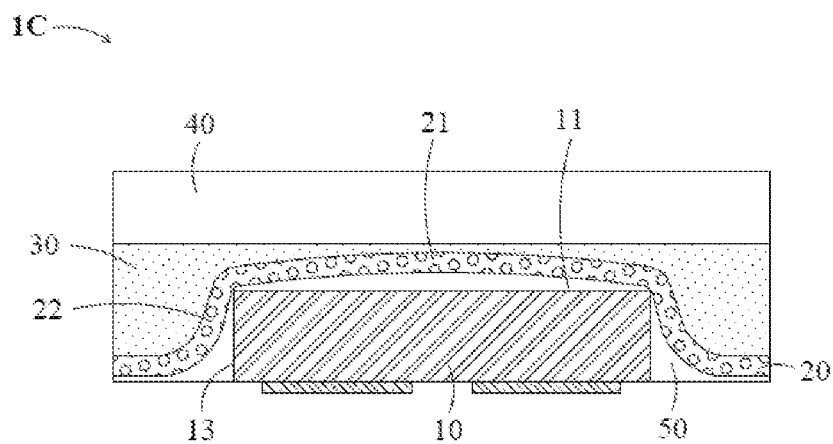
FIG. 5 is a schematic drawing in a cross-sectional view depicting a CSP LED device according to another embodiment of the present disclosure.

FIG. 5 is a schematic drawing in a cross-sectional view of a CSP LED device 1C according to another embodiment of the present disclosure. The difference between the CSP LED device 1C and the aforementioned CSP LED devices 1A and 1B is that the CSP LED device 1C further includes a soft buffer layer 50 sandwiched between the photoluminescent structure 20 and the LED semiconductor die 10. Specifically, the soft buffer layer 50 covers the upper surface 11 and the edge surface 13 of the LED semiconductor die 10. The BSS 30 is subsequently formed as a planarization layer covering the edge portion 22 of the photoluminescent structure 20, and optionally covering the top portion 21 of the photoluminescent structure 20.

The soft buffer layer 50 has the following technical merits: 1) improving the adhesion strength between the photoluminescent structure 20 and the LED semiconductor die 10, 2) relieving the internal stress caused by the mismatch of the coefficients of thermal expansion among the components inside the CSP LED device 1C, and 3) facilitating subsequent fabrication of the photoluminescent structure 20 to form an approximately conformal coating layer. Detailed technical descriptions of the soft buffer layer 50 are disclosed in the U.S. patent application Ser. No. 15/389,417 (also published in the Taiwan Patent Application No. 104144441), and the technical contents are hereby incorporated by reference in its entirety.

Figure 6:
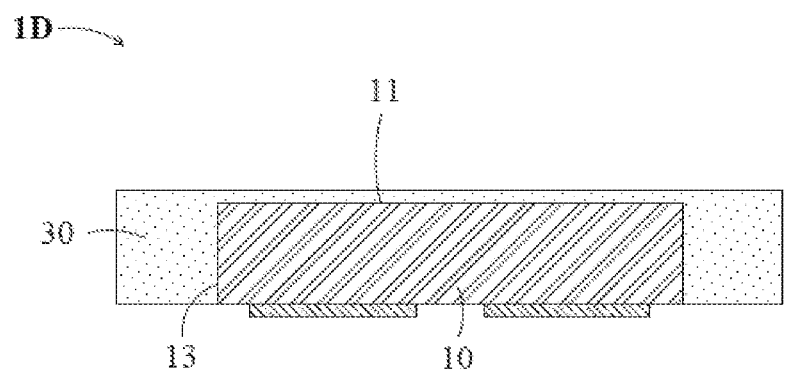
FIG. 6 is a schematic drawing in a cross-sectional view depicting a CSP LED device according to another embodiment of the present disclosure.

FIG. 6 is a schematic drawing in a cross-sectional view of a CSP LED device 1D according to another embodiment of the present disclosure. The difference between the CSP LED device 1D and the aforementioned CSP LED devices 1A, 1B and 1C is that the CSP LED device 1D does not include the photoluminescent structure 20 so that the BSS 30 directly covers and adjoins the edge surface 13 of the LED semiconductor die 10, and optionally covers the upper surface 11 of the LED semiconductor die 10. Without the photoluminescent structure 20, the CSP LED device 1D can provide a monochromatic light beam, such as red, green, blue, infrared, ultraviolet, and so forth. With this specific structure, the CSP LED device 1D can provide a light beam having a smaller viewing angle.

A common technical feature of the aforementioned CSP LED devices 1A to 1D is that the BSS 30 is mainly disposed on the side portion inside the device structure so that a portion of the light beam is re-directed from near horizontal directions to near vertical directions, thus reducing the viewing angle. A CSP LED device 1E according to another embodiment of the present disclosure is that a BSS 30' is disposed remotely above both of the LED semiconductor die 10 and the photoluminescent structure 20 so that a portion of the light beam is re-directed from near vertical directions to near horizontal directions, thus increasing the viewing angle.

Figure 7A:
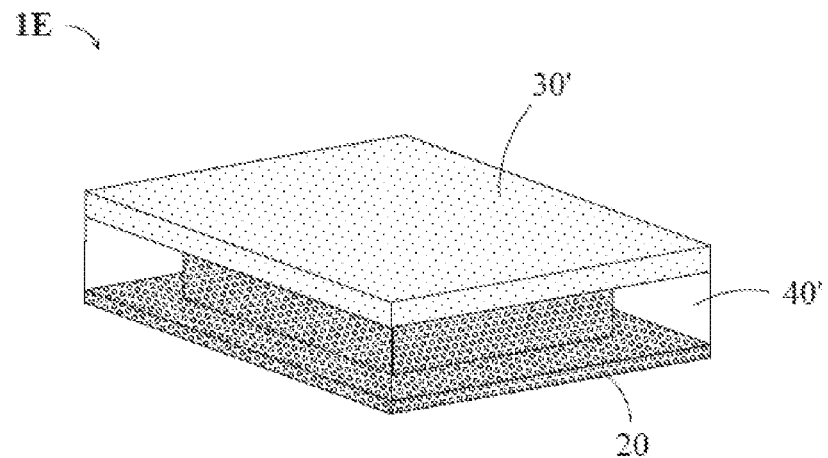
FIG. 7A is a schematic drawing in a 3D perspective view and FIG. 7B is a schematic drawing in a cross-sectional view depicting a CSP LED device according to another embodiment of the present disclosure.
Figure 7B:
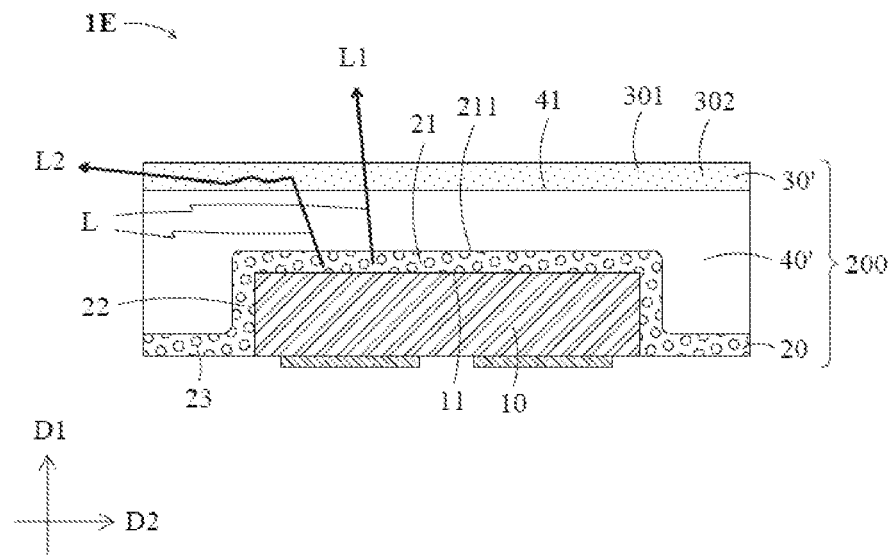

FIG. 7A is a schematic drawing in 3D perspective view, and FIG. 7B is a schematic drawing in a cross-sectional view illustrating the CSP LED device 1E. Similar to the CSP LED device 1A, the CSP LED device 1E also comprises an LED semiconductor die 10, a photoluminescent structure 20, a beam shaping structure (BSS) 30' and a supernatant light-transmitting layer 40'. It will be appreciated that the detailed technical contents of each component of the CSP LED device 1E can be referenced to that of the corresponding component of the CSP LED device 1A; whereas the arrangement of the BSS 30' and the supernatant light-transmitting layer 40' are different from those of the CSP LED device 1A.

Specifically, the supernatant light-transmitting layer 40' is formed as a planarization layer stacked up on the photoluminescent structure 20 so that it covers a top portion 21, an edge portion 22, and an extension portion 23 of the photoluminescent structure 20. As illustrated in FIG. 7B, the supernatant light-transmitting layer 40' functions as a planarization layer as well as a spacer layer sandwiched between the BSS 30' and the photoluminescent structure 20. The BSS 30' is desirably of a substantially uniform thickness, and covers substantially a full area or selectively covers a partial area of the upper surface 41 of the supernatant light-transmitting layer 40'.

The BSS 30' includes light scattering particles 302 with a relatively low concentration, which is not more than about 30 wt. %, not more than about 25 wt. %, not more than about 20 wt. %, not more than about 15 wt. %, or not more than about 10 wt. %, and desirably between about 0.1 wt. % and about 10 wt. %. With this specific embodiment, a portion of the light beam L either directly emitted from the LED semiconductor die 10 or down-converted from the photoluminescent structure 20 travelling in the near vertical direction D1 can enter the BSS 30'. Once penetrating inside the BSS 30', a portion of the light beam L, illustrated as light beam L1 in FIG. 7B, does not significantly change its travelling direction due to the light scattering effect. Another portion of the light beam L, illustrated as light beam L2 in FIG. 7B, is scattered to the near horizontal direction D2 and is finally irradiated outwardly from the edge surface of the BSS 30'.

As a result, the intensity of the light beam travelling in the near horizontal direction D2 of the CSP LED device 1E is increased; whereas the intensity of the light beam travelling in the near vertical direction D1 of the CSP LED device 1E is reduced. Therefore, the light beam L emitted from the CSP LED device 1E will show a larger viewing angle as compared with a comparative CSP LED device without including the BSS 30'. For example, the viewing angle can be increased to be larger than about 160 degrees, such as ranging from larger than about 160 degrees to about 180 degrees. According to one example measurement result, the CSP LED device 1E having the BSS 30' formed on the supernatant light-transmitting layer 40' shows a viewing angle of about 170°, while a comparative CSP LED device without BSS 30' (not illustrated) shows a viewing angle of 140°. Thus, the BSS 30' serves the purpose of increasing the viewing angle of the CSP LED device 1E to fulfill certain applications specifying larger viewing angles.

Next, a manufacturing method to fabricate some embodiments of CSP LED devices according to the present disclosure is described. The manufacturing methods to fabricate the CSP LED devices 1A to 1E are similar, with changing order of sequences. It will be appreciated that some detailed descriptions of the variant embodiments of the manufacturing methods are similar and therefore omitted for the purpose of brevity.

FIG. 8A to FIG. 8F illustrate a manufacturing method to fabricate CSP LED devices according to some embodiments of the present disclosure. The manufacturing method comprises three main fabrication stages: 1) arranging a plurality of LED semiconductor dies 10 to form an array on a release layer 900, 2) forming a packaging sheet layer comprising a plurality of the packaging structures 200 on the array of LED semiconductor dies 10, and 3) singulating the packaging sheet layer to form a plurality of CSP LED devices. The technical details of the manufacturing method are further described as follows.

Figure 8A:
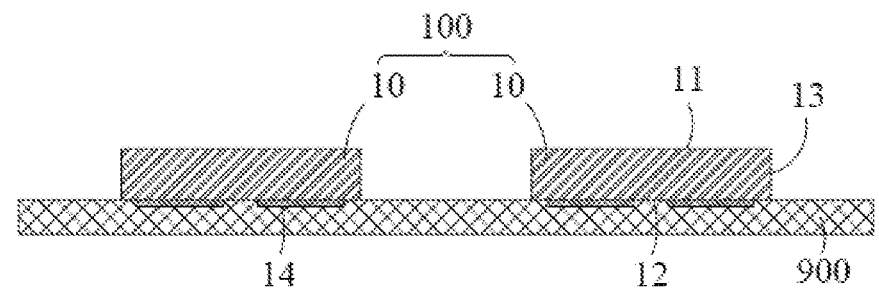
FIG. 8A, FIG. 8B, FIG. 8C, FIG. 8D, FIG. 8E, FIG. 8F, FIG. 9A, and FIG. 9B are schematic drawings illustrating a manufacturing process to fabricate CSP LED devices according to various embodiments of the present disclosure.

The first main fabrication stage is to form an array of LED semiconductor dies. As shown in FIG. 8A, a release layer 900 is prepared first, and the release layer 900 may also be disposed on a carrier substrate (not illustrated), such as a silicon substrate, a glass substrate, a metal substrate, or the like. A plurality of LED semiconductor dies 10 is subsequently arranged on the release layer 900 to form an array of LED semiconductor dies 10 with a substantially fixed distance of pitch. An example embodiment of the release layer 900 is an ultraviolet (UV) light release tape, a thermal release tape, or the like. It is desired that each set of electrodes 14 of the array of the LED semiconductor dies 10 is placed and pressed forcefully so that they are embedded inside the soft release layer 900. This will protect the set of electrodes 14 against contamination during the subsequent fabrication process.

Figure 8B:
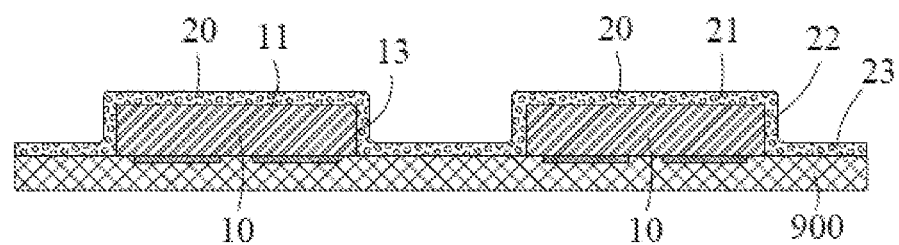
Figure 8C:
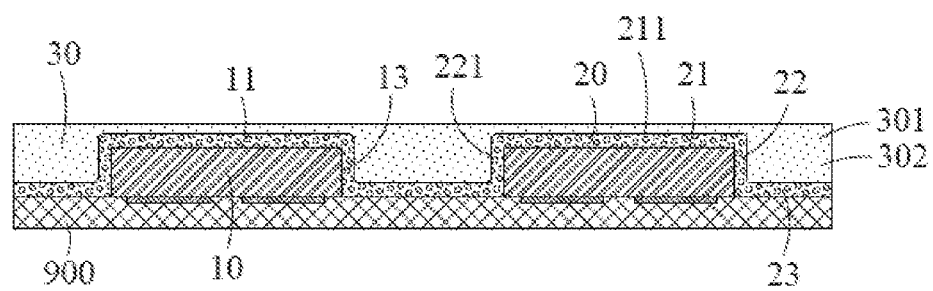
Figure 8D:
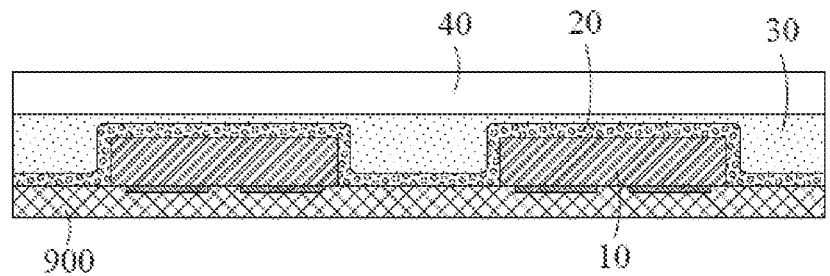

The second main fabrication stage is to form a packaging sheet layer. As shown in FIG. 8B to FIG. 8D, a packaging sheet layer comprising a plurality of the packaging structures 200 is subsequently formed covering the array of LED semiconductor dies 10. The detailed fabrication processes to form the packaging sheet layer on the LED semiconductor dies 10 are described as follows.

As shown in FIG. 8B, a plurality of photoluminescent structures 20 are formed on the array of LED semiconductor dies 10, wherein an edge portion 22 of each photoluminescent structure 20 covers an edge surface 13 of the LED semiconductor die 10, and a top portion 21 of the photoluminescent structure 20 covers an upper surface 11 of the LED semiconductor die 10. The photoluminescent structure 20 may also have an extension portion 23 stretching outwardly from the edge portion 22 as well as overlaying the surface of the release layer 900. Desirably, the photoluminescent structure 20 can be formed by the method disclosed in the U.S. Patent Publication No. US2010/0119839, wherein one or more layers of photoluminescent materials and polymer resin materials are deposited sequentially to form the photoluminescent structure 20. Therefore, the photoluminescent structure 20 formed by this method can be a multi-layered structure. The technical contents of the U.S. patent publication are hereby incorporated by reference in its entirety.

Next, as shown in FIG. 8C, a planarization layer comprising the beam shaping structures (BSS) 30 is formed covering the edge portions 22 and the top portions 21 of the photoluminescent structures 20. Alternatively, the BSS 30 may be specified not to cover the top portion 21 of the photoluminescent structure 20 during the manufacturing process of the BSS 30 to form the embodiment of CSP LED device 1A shown in FIG. 2A and FIG. 2B. Optionally, the BSS 30 may be fabricated in such a way that its upper surface is lower than the upper surface 211 of the top portion 21 so that the edge surface 221 of the photoluminescent structure 20 is partially exposed to form another embodiment of CSP LED device 1A shown in FIG. 3B.

As for the fabrication process of forming the BSS 30, it is desirable that a composition material to fabricate the BSS 30 is formed by dispersing light scattering particles 302 inside a polymer resin material 301. The composition material may further be diluted using an organic solvent, such as octane, xylene, acetate, ether, toluene, and so forth, to lower its viscosity. The diluted composition material having a relatively low viscosity may be coated onto the photoluminescent structures 20 using a fabrication process such as spray coating or the like. Due to its low viscosity, the composition material will flow to form a planarization layer over the photoluminescent structures 20 with a substantially level upper surface, as shown in FIG. 8C. The composition material of the BSS 30 may also be formed by other fabrication processes such as dispensing, printing, molding, or so forth. Lastly, a thermal or UV curing process is used to solidify the BSS 30.

Although the BSS 30 does not adjoin the LED semiconductor die 10 directly, the outer envelope of the LED semiconductor die 10 is still covered or sheltered remotely by the BSS 30 with the photoluminescent structure 20 sandwiched in between. In other words, the BSS 30 is disposed along the light path of the LED semiconductor die 10. Thus, not only the light beam irradiated from the photoluminescent structure 20 but also the light beam emitted from the LED semiconductor die 10 will be shaped by the BSS 30.

Next, as shown in FIG. 8D, a supernatant light-transmitting layer 40 is formed covering the photoluminescent structures 20 and/or the BSS 30. Desirably, the supernatant light-transmitting layer 40 is fabricated using a substantially transparent polymer resin material, which can be coated on the photoluminescent structure 20 and/or the BSS 30 through a proper fabrication process such as spray coating, spin coating, molding, dispensing, or the like. The polymer resin material is subsequently solidified using a thermal or UV curing process.

With the fabrication process described above, a packaging sheet layer comprising a plurality of packaging structures 200 to fabricate the embodiment of the CSP LED device 1A is formed accordingly, wherein the packaging structures 200 are still connected with one another after completing the aforementioned fabrication process. Some variant fabrication processes to form various packaging structures 200 corresponding to other embodiments of the CSP LED devices according to the present disclosure are described as follows.

If it is not desirable to incorporate the supernatant light-transmitting layer 40 inside the package structure 200, the fabrication process of forming the supernatant light-transmitting layer 40 shown in FIG. 8D may be omitted. Thus, a CSP LED device without the supernatant light-transmitting layer 40 can be obtained.

If the packaging structure 200 corresponding to the embodiment of the CSP LED device 1B shown in FIG. 4 is specified, the fabrication process of forming the photoluminescent structure 20 shown in FIG. 8B can be implemented using alternative fabrication processes such as molding or printing. Thus, a photoluminescent structure 20 without the extension portion 23 can be fabricated, and the BSS 30 will accordingly be formed covering the release layer 900 in the next fabrication process as illustrated in FIG. 8C.

If the packaging structure 200 corresponding to the embodiment of the CSP LED device 1C as illustrated in FIG. 5 is specified, a soft buffer layer 50 can be formed first desirably by way of spray coating after completing the fabrication process of arranging LED semiconductor dies 10 as shown in FIG. 8A. Then, the fabrication process shown in FIG. 8B follows subsequently to form the photoluminescent structures 20 covering the soft buffer layers 50.

If the packaging structure 200 corresponding to the embodiment of the monochromatic CSP LED device 1D shown in FIG. 6 is specified, the fabrication process of forming the photoluminescent structure 20, as shown in FIG. 8B, can be omitted. In the subsequent fabrication process shown in FIG. 8C, the BSS 30 can be formed to directly to cover the edge surface 13 of the LED semiconductor die 10, and can optionally be formed to further cover the upper surface 11 of the LED semiconductor die 10.

Figure 9A:
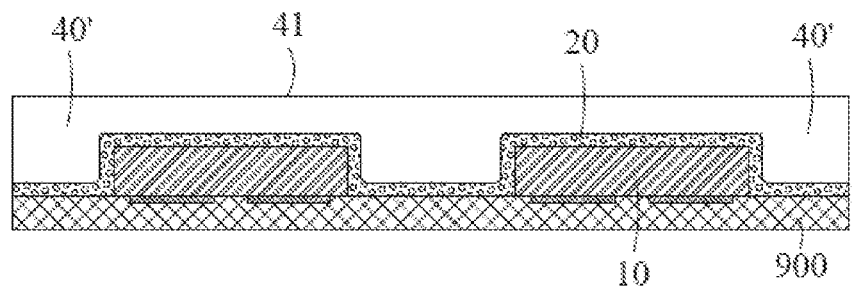
Figure 9B:
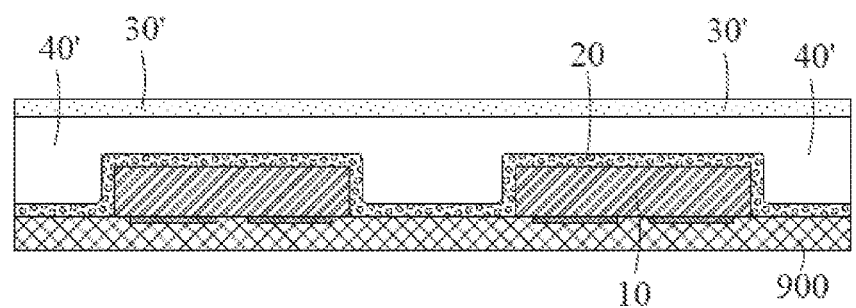

If the packaging structure 200 corresponding to the embodiment of the CSP LED device 1E to have a larger viewing angle as illustrated in FIG. 7B is specified, the fabrication process shown in FIG. 8B (forming a photoluminescent structure layer 20), FIG. 9A (forming a supernatant light-transmitting layer 40') and FIG. 9B (forming a remote BSS layer 30') can be performed sequentially.

Figure 8E:
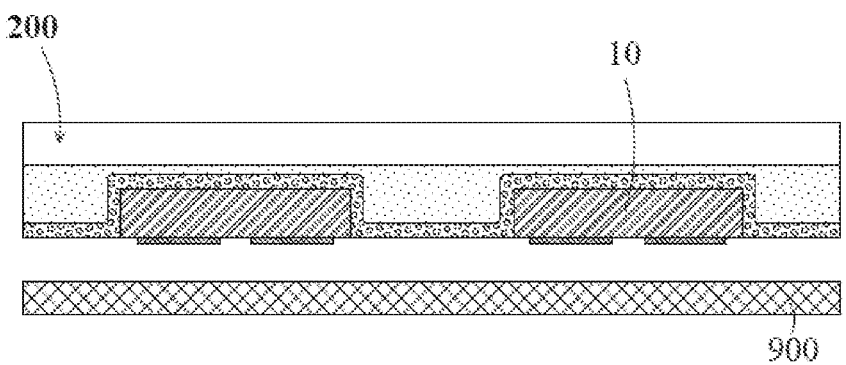
Figure 8F:
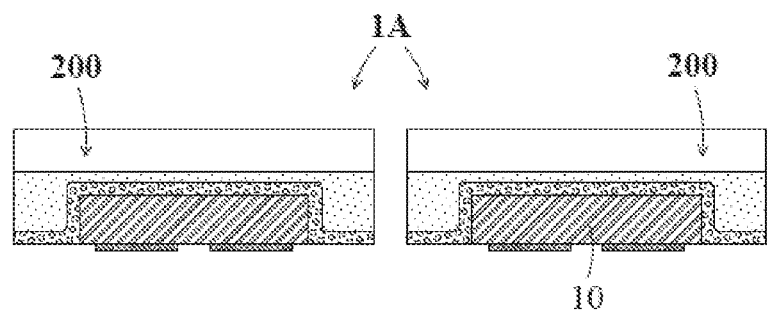

The third main fabrication stage is to singulate the packaging sheet layer. After the desired packaging structures 200 are formed as the sheet layer in the second main fabrication stage, the release layer 900 may be removed as shown in FIG. 8E. Next, the packaging sheet layer comprising the plurality of packaging structures 200 are singulated as illustrated in FIG. 8F. Thus, a plurality of the CSP LED devices 1A to 1E are obtained. It will be appreciated that the release layer 900 can be removed after the singulating process is performed.

In view of the above, some variant embodiments of the manufacturing methods are disclosed to fabricate various CSP LED devices incorporating various embodiments of beam shaping structures so that the viewing angle of the CSP LED device can be properly shaped to meet the specifications in various applications. Also, the disclosed methods are well suitable in a batch-type mass production process.

While the disclosure has been described with reference to the specific embodiments thereof, it should be understood by those skilled in the art that various changes may be made and equivalents may be substituted without departing from the true spirit and scope of the disclosure as defined by the appended claims. In addition, many modifications may be made to adapt a particular situation, material, composition of matter, method, or process to the objective, spirit and scope of the disclosure. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the disclosure. Accordingly, unless specifically indicated herein, the order and grouping of the operations are not limitations of the disclosure.

What is claimed is:
1. A light emitting device comprising:
a flip-chip light emitting diode (LED) semiconductor die comprising an upper surface, a lower surface opposite to the upper surface, an edge surface, and a set of electrodes, wherein the edge surface extends between the upper surface of the LED semiconductor die and the lower surface of the LED semiconductor die, and the set of electrodes is disposed on the lower surface of the LED semiconductor die;
a photoluminescent structure comprising a top portion disposed on the upper surface of the LED semiconductor die, and an edge portion covering the edge surface of the LED semiconductor die;
a beam shaping structure disposed surrounding an edge surface of the edge portion of the photoluminescent structure, wherein the beam shaping structure comprises a polymer resin material and light scattering particles dispersed in the polymer resin material with a weight percentage of the light scattering particles in the beam shaping structure not greater than 30%, and the beam shaping structure is configured to reduce a viewing angle of the light emitting device by scattering and redirecting a portion of a light beam emitted from the edge surface of the LED semiconductor die, the redirecting causing the portion of the light beam passing through the photoluminescent structure to penetrate through the beam shaping structure toward an upper surface of the beam shaping structure, wherein the upper surface of the beam shaping structure is substantially level with an upper surface of the top portion of the photoluminescent structure; and
a light-transmitting layer disposed on the upper surface of the beam shaping structure and on the upper surface of the top portion of the photoluminescent structure.

2. The light emitting device according to claim 1, wherein the weight percentage of the light scattering particles in the beam shaping structure is not greater than 10% and not less than 0.1%.

3. The light emitting device according to claim 1, wherein the light scattering particles comprise at least one of $TiO_2$, BN, $SiO_2$, or $Al_2O_3$, and the polymer resin material comprises at least one of silicone, epoxy, or rubber.

4. The light emitting device according to any one of claims 1 to 3, wherein the photoluminescent structure further comprises an extension portion extending outwardly from the edge portion of the photoluminescent structure, and the beam shaping structure further covers an upper surface of the extension portion of the photoluminescent structure.

5. The light emitting device according to any one of claims 1 to 3, wherein a lower surface of the beam shaping structure is substantially level with a lower surface of the edge portion of the photoluminescent structure.

6. The light emitting device according to claim 1, wherein a lower surface of the edge portion of the photoluminescent structure is substantially level with the lower surface of the LED semiconductor die.

7. A light emitting device comprising:
a flip-chip light emitting diode (LED) semiconductor die comprising an upper surface, a lower surface opposite to the upper surface, an edge surface, and a set of electrodes, wherein the edge surface extends between the upper surface of the LED semiconductor die and the lower surface of the LED semiconductor die, and the set of electrodes is disposed on the lower surface of the LED semiconductor die;
a photoluminescent structure comprising a top portion disposed on the upper surface of the LED semiconductor die, and an edge portion covering the edge surface of the LED semiconductor die;
a light-transmitting layer disposed on the top portion of the photoluminescent structure and surrounding the edge portion of the photoluminescent structure, wherein the photoluminescent structure is disposed between the light-transmitting layer and the LED semiconductor die; and
a beam shaping structure covering an upper surface of the light-transmitting layer and exposing an edge surface of the light-transmitting layer, wherein the beam shaping structure comprises a polymer resin material and light scattering particles dispersed in the polymer resin material with a weight percentage of the light scattering particles in the beam shaping structure not greater than 30%,
wherein the beam shaping structure is configured to increase a viewing angle of the light emitting device by redirecting a portion of a light beam emitted from the top portion of the photoluminescent structure toward an edge surface of the beam shaping structure so as to be emitted outwardly from the light emitting device through the edge surface of the beam shaping structure.

8. The light emitting device according to claim 7, wherein the weight percentage of the light scattering particles in the beam shaping structure is not greater than 10% and not less than 0.1%.

9. The light emitting device according to claim 7, wherein the light scattering particles comprise at least one of $TiO_2$, BN, $SiO_2$, or $Al_2O_3$, and the polymer resin material comprises at least one of silicone, epoxy, or rubber.

10. The light emitting device according to claim 7, wherein a lower surface of the edge portion of the photoluminescent structure is substantially level with the lower surface of the LED semiconductor die.

11. A light emitting device comprising:
a flip-chip light emitting diode (LED) semiconductor die comprising an upper surface, a lower surface opposite to the upper surface, an edge surface, and a set of electrodes, wherein the edge surface extends between the upper surface of the LED semiconductor die and the lower surface of the LED semiconductor die, and the set of electrodes is disposed on the lower surface of the LED semiconductor die; and
a beam shaping structure covering at least the edge surface of the LED semiconductor die, wherein the beam shaping structure comprises a polymer resin material and light scattering particles dispersed in the polymer resin material with a weight percentage of the light scattering particles in the beam shaping structure not greater than 30%, and the beam shaping structure is configured to reduce a viewing angle of the light emitting device by scattering and redirecting a portion of a light beam emitted from the edge surface of the LED semiconductor die, the redirecting causing the portion of the light beam to penetrate through the beam shaping structure toward an upper surface of the beam shaping structure, wherein the upper surface of the beam shaping structure is substantially level with the upper surface of the LED semiconductor die, the beam shaping structure directly contacts the edge surface of the LED semiconductor die, and the set of electrodes of the LED semiconductor die is exposed from the beam shaping structure.

12. The light emitting device according to claim 11, wherein a lower surface of the beam shaping structure is substantially level with the lower surface of the LED semiconductor die.

13. A light emitting device comprising:
a flip-chip light emitting diode (LED) semiconductor die comprising an upper surface, a lower surface opposite to the upper surface, an edge surface, and a set of electrodes, wherein the edge surface extends between the upper surface of the LED semiconductor die and the lower surface of the LED semiconductor die, and the set of electrodes is disposed on the lower surface of the LED semiconductor die;
a light-transmitting layer disposed on the upper surface of the LED semiconductor die and surrounding the edge surface of the LED semiconductor die; and
a beam shaping structure covering an upper surface of the light-transmitting layer and exposing an edge surface of the light-transmitting layer, wherein the beam shaping structure comprises a polymer resin material and light scattering particles dispersed in the polymer resin material with a weight percentage of the light scattering particles in the beam shaping structure not greater than 30%, and the beam shaping structure is configured to increase a viewing angle of the light emitting device by redirecting a portion of a light beam toward an edge surface of the beam shaping structure so as to be emitted outwardly from the light emitting device through the edge surface of the beam shaping structure.

\* \* \* \* \*